(12) United States Patent
Barsatan

(10) Patent No.: US 9,772,350 B2
(45) Date of Patent: Sep. 26, 2017

(54) RF PROBE

(71) Applicant: Advantest Corporation, Tokyo (JP)

(72) Inventor: Randy Barsatan, Boblingen (DE)

(73) Assignee: Advantest Corporation, Tokyo (JP)

( * ) Notice: Subject to any disclaimer, the term of this patent is extended or adjusted under 35 U.S.C. 154(b) by 100 days.

(21) Appl. No.: 14/739,314

(22) Filed: Jun. 15, 2015

(65) Prior Publication Data

US 2015/0276809 A1    Oct. 1, 2015

Related U.S. Application Data

(63) Continuation of application No. PCT/EP2012/075771, filed on Dec. 17, 2012.

(51) Int. Cl.
*G01R 1/067* (2006.01)
*G01R 31/319* (2006.01)
*G01R 31/28* (2006.01)

(52) U.S. Cl.
CPC ..... *G01R 1/06772* (2013.01); *G01R 1/06766* (2013.01); *G01R 31/2834* (2013.01); *G01R 31/31905* (2013.01); *G01R 31/31908* (2013.01)

(58) Field of Classification Search
CPC .................................................. G01R 1/06772
See application file for complete search history.

(56) References Cited

U.S. PATENT DOCUMENTS

| | | | |
|---|---|---|---|
| 4,853,627 A | 8/1989 | Gleason et al. | |
| 4,891,577 A | 1/1990 | Ishikawa | |
| 5,821,758 A | 10/1998 | Jindal | |
| 6,242,930 B1 | 6/2001 | Matsunaga et al. | |
| 2001/0017549 A1* | 8/2001 | Inoue et al. | G01R 1/06772 324/750.27 |
| 2001/0035800 A1 | 11/2001 | Miller | |
| 2003/0011390 A1* | 1/2003 | Smith et al. | G01R 1/07378 324/754.03 |
| 2004/0021454 A1* | 2/2004 | Jevtic et al. | G01R 1/06772 324/72.5 |
| 2004/0104785 A1* | 6/2004 | Park et al. | H01P 5/028 333/33 |
| 2006/0121873 A1* | 6/2006 | Ammar | G01K 11/006 455/326 |
| 2007/0182428 A1 | 8/2007 | Tamaki et al. | |
| 2008/0052028 A1 | 2/2008 | Pickerd et al. | |
| 2009/0267624 A1 | 10/2009 | Halter et al. | |

* cited by examiner

*Primary Examiner* — Clayton E Laballe
*Assistant Examiner* — Noam Reisner

(57) ABSTRACT

Embodiments of the present invention provide an RF probe for coupling out a probe signal from a transmission line of a circuit. The RF probe includes at least two probe pins having first ends for contacting the circuit and second ends. Furthermore, the RF probe includes a provider for providing a variable impedance at the second ends of the probe pins. The RF probe is configured to provide the probe signal based on a signal propagating along at least one of the probe pins.

21 Claims, 15 Drawing Sheets

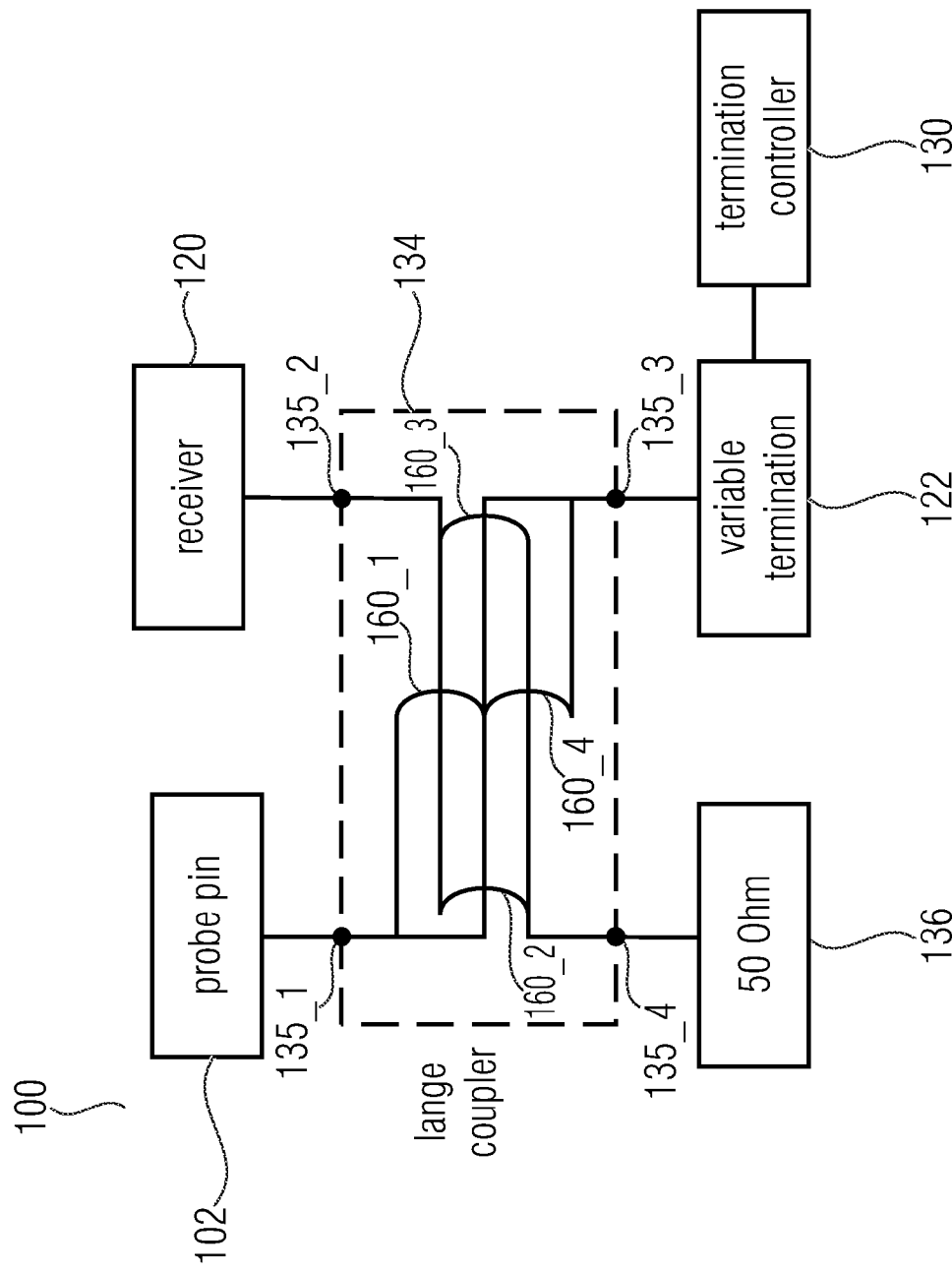

RF PROBE

CROSS-REFERENCE TO RELATED APPLICATIONS

This application is a continuation of copending International Application No. PCT/EP2012/075771, filed Dec. 17, 2012, which is incorporated herein by reference in its entirety.

BACKGROUND OF THE INVENTION

Embodiments of the present invention relate to an RF probe for coupling a probe signal out from a transmission line of a circuit under test. Further embodiments relate to an automated test equipment comprising an RF probe and a receiver. Further embodiments relate to a method for coupling a probe signal out from a transmission line of a circuit under test. Some embodiments relate to a non-invasive RF in-circuit probe having extended operating frequency.

FIG. 1a shows a block diagram of a conventional non-invasive RF probe 10. The RF probe comprises a probe pin/contact block 12 and a high impedance element/circuit 14 connected in series between the probe pin/contact 12 and an external receiver 16. The high impedance element/circuit 14 can be a high-valued series resistor or a field effect transistor.

FIG. 1b shows an illustrative view of a tip of a conventional non-invasive RF probe 10 comprising a ground pin 12_1 and a signal pin 12_2.

The high input impedance characteristic of typical high impedance RF probes for in-circuit testing is determined at low frequencies mainly by the input impedance of the frontend circuitry of the probe. When the probe's input impedance is high, the circuit under test is unperturbed and therefore the probe is considered non-invasive.

While a typical probe retains its non-invasive characteristic at low frequencies, the minimum manufacturable length L, measured from the probe tip (tip of the probe pins 12) to the high impedance element/circuit 14 of the RF probe 10, becomes a limiting factor when using the probes at high frequencies. When this length L becomes comparable to the wavelength of the operating frequency, a behavior called impedance transformation converts a previously high input impedance of the RF probe 10 into a low impedance. This causes it to disturb or be invasive to the probed device under test (DUT) line, as will become clear from the probed DUT line frequency response shown in FIG. 2. FIG. 2 shows in a diagram the probed DUT line frequency response for a conventional non-invasive RF probe 10 having a length L of 4.5 mm. In FIG. 2, the ordinate denotes the insertion gain (negative insertion loss) in dB, where the abscissa denotes the frequency in GHz. Thereby, the RF probe 10 is considered non-invasive (having a high input impedance) in the frequency region where the insertion loss is smaller than 1.5 dB, wherein the RF probe is considered invasive in the frequency region where the insertion loss is greater than 1.5 dB.

The highest operating frequency of the probe 10 is therefore constrained by the practical limits of the available micromachining technologies, in making the probe pin 12 as short as possible, and by electronics assembly techniques, in placing the probe circuitry 14 as close as possible to the probe tip.

A commercial high impedance active probe is the 85024 from Agilent Technologies. A short fixed-pin probe leads to an active circuitry that has a high input impedance. The prescribed frequency of operation is limited to 3 (GHz.

The RealProbe107 from Vectra has a higher operating frequency compared to the probe 85024 from Agilent Technologies. The probe comprises a coupling loss of 20 dB and therefore is presumably a passive probe. The probe can work until 7 GHz with an insertion loss of 1.5 dB on the probed DUT line.

The RealProbe 109 from Vectra has a similar architecture as the RealProbe107, except that the probe pin is constructed on the PCB thus making the length L shorter. The probe is advertised to work until 18 GHz. The use of the PCB as a probe pin could compromise its long term reliability when the probe is used continuously.

The RF probe 1205 from Aeroflex Corporation is similar in architecture as the probe from Agilent Technologies but with several grounding suggestions. It is limited in operation until 4 GHz.

Furthermore, U.S. Pat. No. 4,853,627 shows a wafer probe constructed with a probe pin and a PCB, placed on a support membrane, containing a high impedance amplifier component.

Moreover, U.S. Pat. No. 5,821,758 shows an RF in-circuit method for non-invasive measurements using signal redirection. Thereby, the approach of using 2 fingers in measurement necessitates a relatively large amount of printed circuit board space on the DUT, and the use of removable passives in creating contacts to redirect the signal can potentially lead to inconsistent measurements.

SUMMARY

According to an embodiment, an RF probe for coupling a probe signal out from a transmission line of a circuit may have: at least two probe pins having first ends for contacting the circuit and second ends, wherein a length of the probe pins is greater than $\lambda/10$, wherein $\lambda$ is a wavelength of the probe signal to be coupled out by the RF probe; and means for providing a variable impedance at the second ends of the probe pins; wherein the RF probe is configured to provide the probed signal based on a signal propagating along at least one of the probe pins; wherein the means for providing the variable impedance are configured to provide the variable impedance at the second ends of the probe pins such that a frequency at which a high impedance occurs at the first ends of the probe pins is variable; and wherein the means for providing the variable impedance are configured to provide the variable impedance at the second ends of the probe pins such that the high impedance occurs at an operating frequency of the probe signal.

According to another embodiment, an automated test equipment may have: an inventive RF probe; and a receiver for receiving the probe signal.

According to another embodiment, a method for coupling out a probe signal from a transmission line of a circuit may have the steps of: contacting the circuit with first ends of at least two probe pins of an RF probe, wherein a length of the probe pins is greater than $\lambda/10$, wherein $\lambda$ is a wavelength of the probe signal to be coupled out by the RF probe; providing a variable impedance at second ends of the probe pins, wherein the variable impedance is provided at the second ends of the probe pins such that a frequency at which a high impedance occurs at the first ends of the probe pins is variable; providing the probe signal based on a signal propagating along at least one of the probe pins; and providing a control signal based on an operating frequency of a signal propagating along the transmission line of the circuit such that the RF probe provides a high impedance at the first ends of the probe pins at the operating frequency of the signal propagating along the transmission line of the circuit.

Embodiments of the present invention provide an RF probe for coupling a probe signal out from a transmission line of a circuit under test. The RF probe comprises at least two probe pins having first ends for contacting the circuit and second ends. Furthermore, the RF probe comprise means for providing a variable impedance at the second ends of the probe pins. The RF probe is configured to provide the probe signal based on a signal propagating along at least one of the probe pins.

According to the concept of the present invention an insertion loss on the signal propagating along the transmission line of the circuit under test caused by contacting the transmission line with the first ends of the probe pins can be reduced by the means for providing the variable impedance at the second ends of the probe pins. The probe pins transform the impedance present at the second ends of the probe pins based on the length of the probe pins as well as the characteristic impedance it forms, into a transformed impedance present at the first ends of the probe pins. Thus, by adjusting the variable impedance provided at the second ends of the probe pins the frequency at which a high impedance occurs at the first ends of the probe pins can be set or selected.

BRIEF DESCRIPTION OF THE DRAWINGS

Embodiments of the present invention will be detailed subsequently referring to the appended drawings, in which:

FIG. 11b shows a block diagram of a possible implementation of the Lange coupler of the means for providing the variable impedance of the RF probe shown in FIG. 11a.

DETAILED DESCRIPTION OF THE INVENTION

Figure 1A:
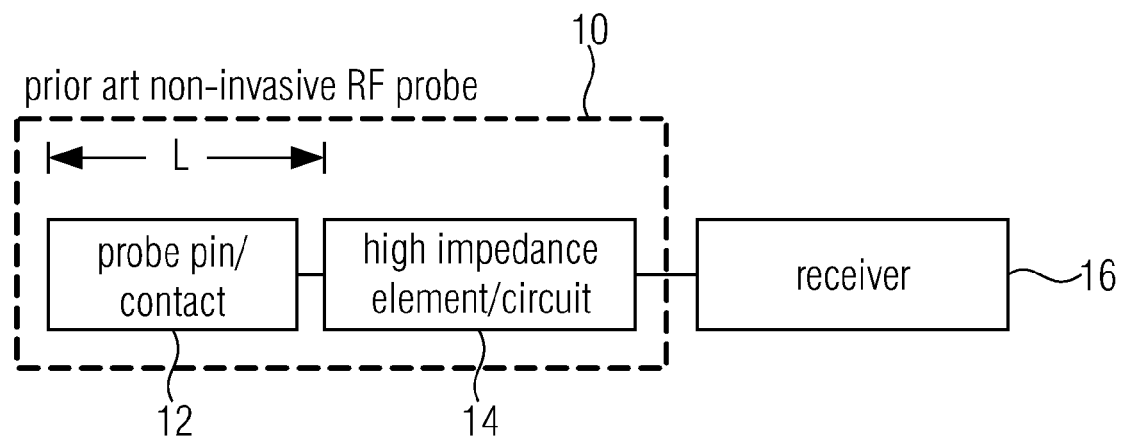
FIG. 1a shows a block diagram of a conventional non-invasive RF probe.
Figure 1B:
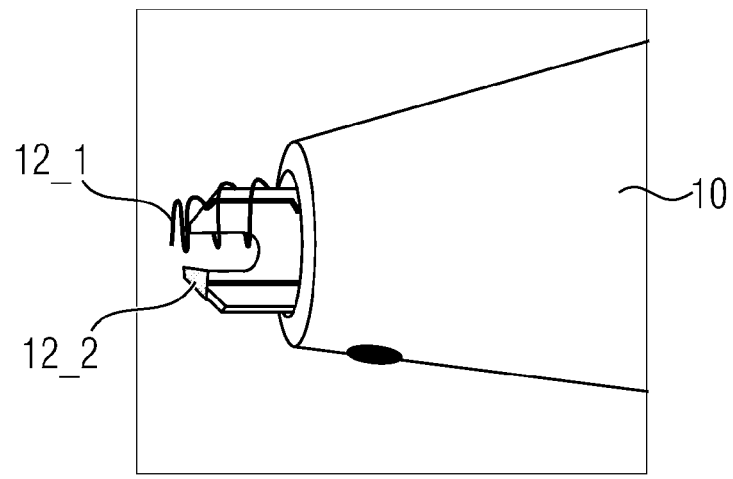
FIG. 1b shows an illustrative view of a tip of a conventional non-invasive RF probe.
Figure 2:
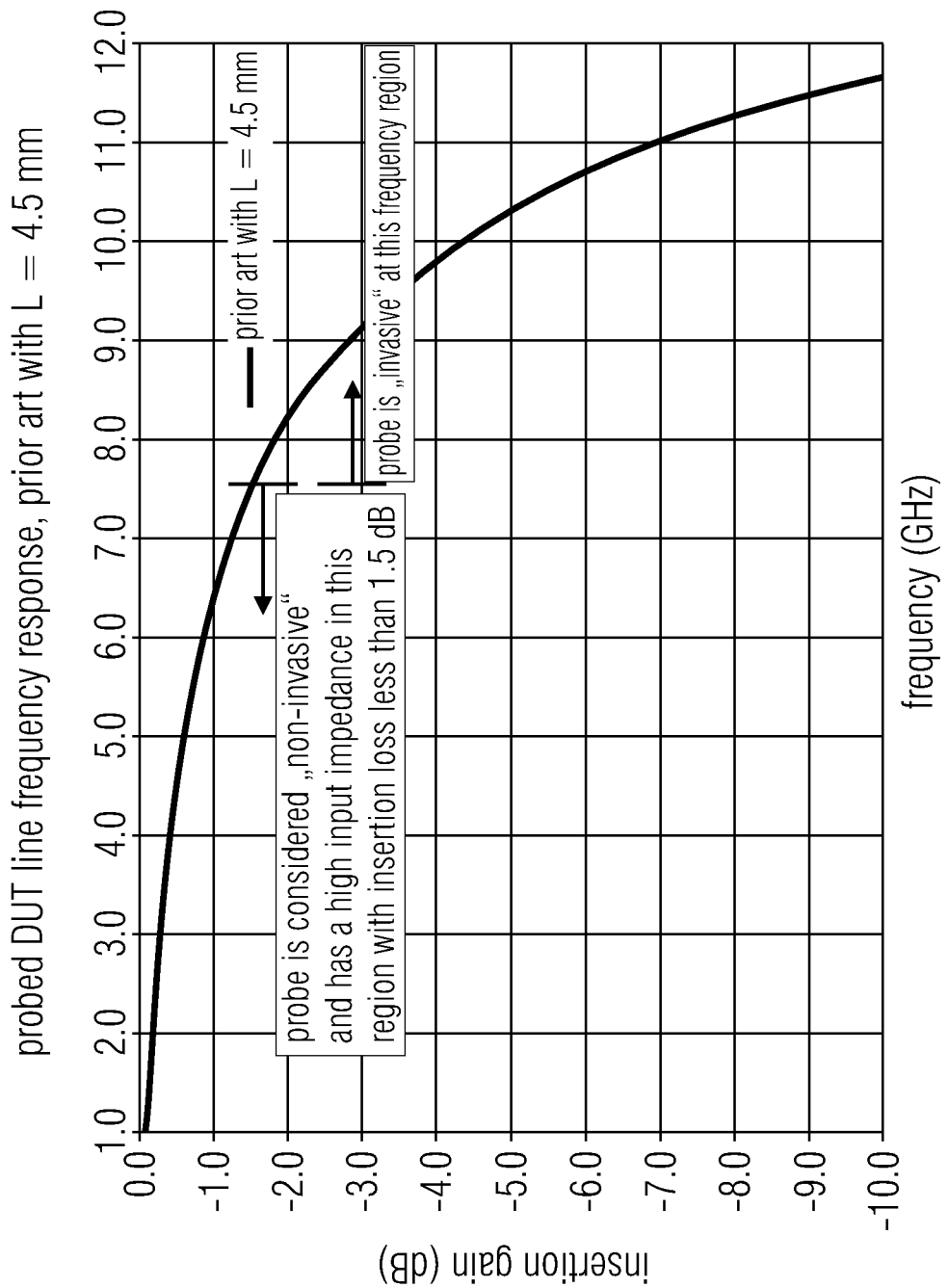
FIG. 2 shows in a diagram a probed DUT line frequency response for a conventional non-invasive RF probe having a length L of 4.5 mm.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form, rather than in detail, in order to avoid obscuring embodiments of the present invention. In addition, features of the different embodiments described hereinafter may be combined with each other, unless specifically noted otherwise.

Figure 3:
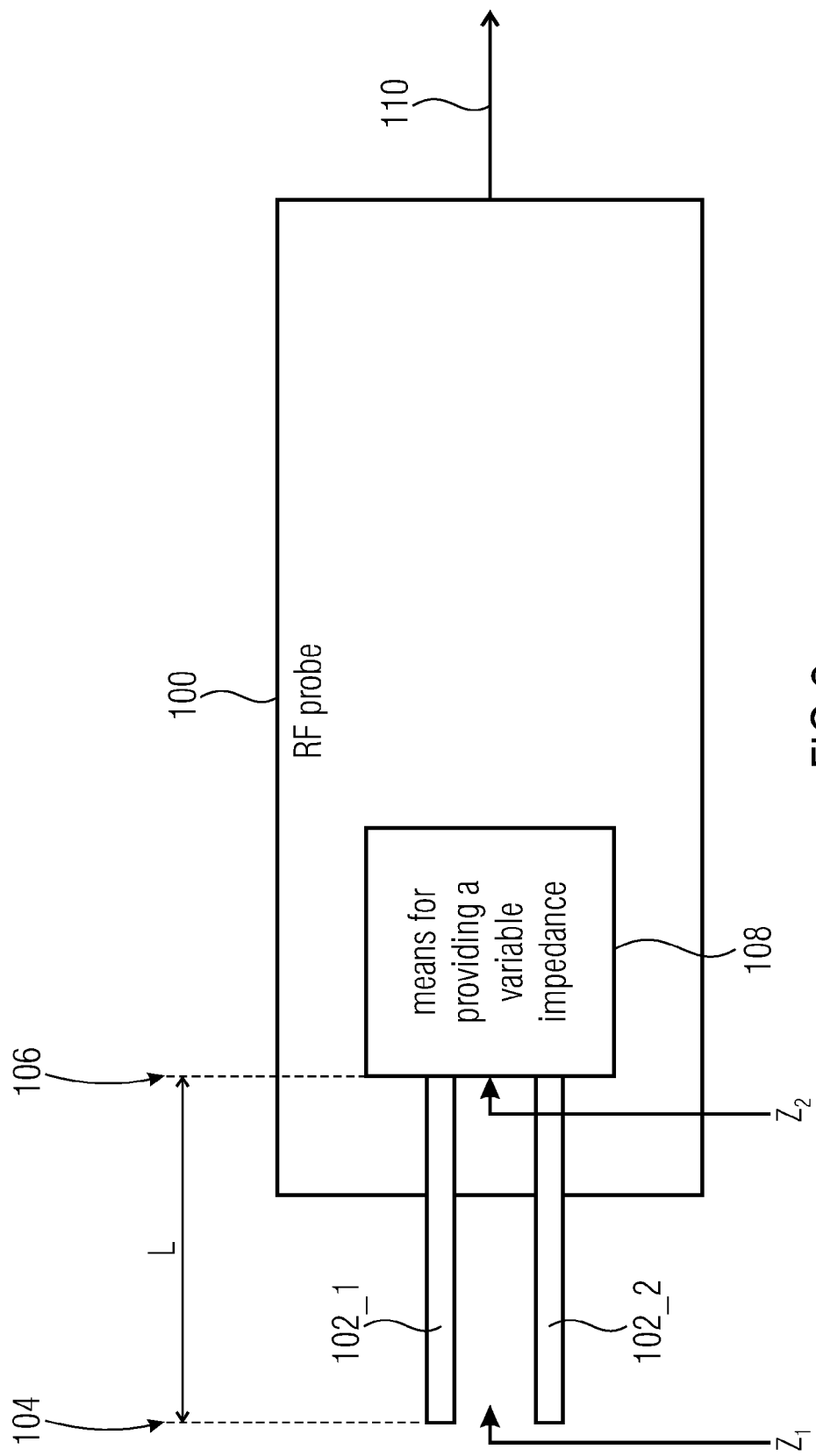
FIG. 3 shows a block diagram of an RF probe for coupling out a probe signal from a transmission line of a circuit, according to an embodiment of the present invention.

FIG. 3 shows a block diagram of an RF probe 100 for coupling out a probe signal 110 from a transmission line of a circuit under test, according to an embodiment of the present invention. The RF probe 100 comprises at least two probe pins 102_1 to 102_n (n≥2) having first ends 104 for contacting the circuit and second ends 106. Furthermore, the RF probe 100 comprises means 108 for providing a variable impedance $Z_2$ at the second ends 106 of the probe pins 102_1 to 102_n (n≥2). The RF probe 100 is configured to provide the probe signal 110 based on a signal propagating along at least one of the probe pins 102_1 to 102_n (n≥2).

According to the concept of the present invention, the increasing insertion loss at increasing operation frequencies caused by contacting the transmission line of the circuit with the first ends 104 of the probe pins 102_1 to 102n (n≥2) can be reduced by the means for providing a variable impedance at the second ends of the probe pins 102_1 to 102_n (n≥2). The probe pins 102_1 to 102n (n≥2) transform the impedance $Z_2$ present at the second ends 106 of the probe pins 102_1 to 102_n (n≥2) based on the length L of the probe pins 102_1 to 102_n (n≥2) as well as the characteristic impedance that it forms, into a transformed impedance $Z_1$ present at the first ends 104 of the probe pins 102_1 to 102_n (n≥2). Thus, by adjusting the variable impedance $Z_2$ provided at the second ends 106 of the probe pins 102_1 to 102_n (n≥_2) the frequency at which a high impedance (e.g., leading to an insertion loss smaller than 1.5 dB (or 1.2 dB, or 1.0 dB, or 0.7 dB)) occurs at the first ends 104 of the probe pins 102_1 to 102_n (n≥2) can be set or selected.

Thus, some embodiments address the frequency limitation problem and extend the probe's 100 operating frequency range beyond what is normally allowed by the available micromachining and electronics assembly technologies while keeping its non-invasive property. Thereby, the RF probe 100 is considered non-invasive if the insertion loss on the signal propagating along the transmission line of the circuit is smaller than 1.5 dB (or 1.2 dB, or 1.0 dB, or 0.7 dB).

For example, the frequency limitation can be circumvented by using the periodic property of the impedance transformation, where the high impedance characteristic of the probe repeats at frequencies where the length L is equal to about multiple of half the wavelength. By having a mechanism to vary the frequencies at which the subsequent high impedance bands occur, a continuous and extended frequency band can be achieved by operating the probe at either the primary and the subsequent frequency ranges.

Note that the RF probe 100 can comprise up to n probe pins 102_1 to 102_n, wherein n is a natural number greater than or equal to two (n≥2). For example, as shown in FIG. 3, the RF probe 100 may comprise two probe pins 102_1 to 102_n (n=2). In that case, a first probe pin 102_1 of the two probe pins 102_1 to 102_n (n=2) may be a signal pin, wherein a second probe pin 102_2 of the two probe pins 102_1 to 102.n (n=2) may be a reference potential (e.g., ground) pin. Moreover, the RF probe 100 may also comprise three probe pins 102_1 to 102_n (n=3). In that case, a first probe pin 102_1 of the three probe pins 102_1 to 102n (n=3) may be a signal pin, wherein a second probe pin 102_2 and a third probe pin 102_3 of the three probe pins 102_1 to 102_n (n=3) may be reference potential (e.g., ground) pins.

As already indicated, the probe pins 102_1 to 102n (n≥2) form a transmission line which transforms the impedance $Z_2$ present at the second ends 106 of the probe pins 102_1 to 102_n (n≥2) into a transformed impedance $Z_1$ at the first ends 104 of the probe pins 102_1 to 102_n (n≥2). Thus, the means 108 for providing the variable impedance can be configured to provide the variable impedance $Z_2$ at the second ends 106 of the probe pins 102_1 to 102_n (n≥2) such that a frequency at which a high impedance $Z_1$ occurs at the first ends 104 of the probe pins 102_1 to 102n (n≥2) is variable.

Observe that, the length L of the probe pins 102_1 to 102n (n≥2), e.g., the length L between the first ends 104 of the probe pins 102_1 to 102_n (n≥2) and the second ends 106 of the probe pins 102_1 to 102_n (n≥2) or the means 108 for providing the variable impedance, can be greater than λ/20 (or λ/10, or λ/15). λ can be the wavelength of a signal to be coupled out by the RF probe 100 from the transmission line of the circuit. Moreover, the high impedance can be an impedance having a magnitude greater than or equal to 500Ω (or 250 Ω, 750Ω or 1000Ω).

Figure 4:
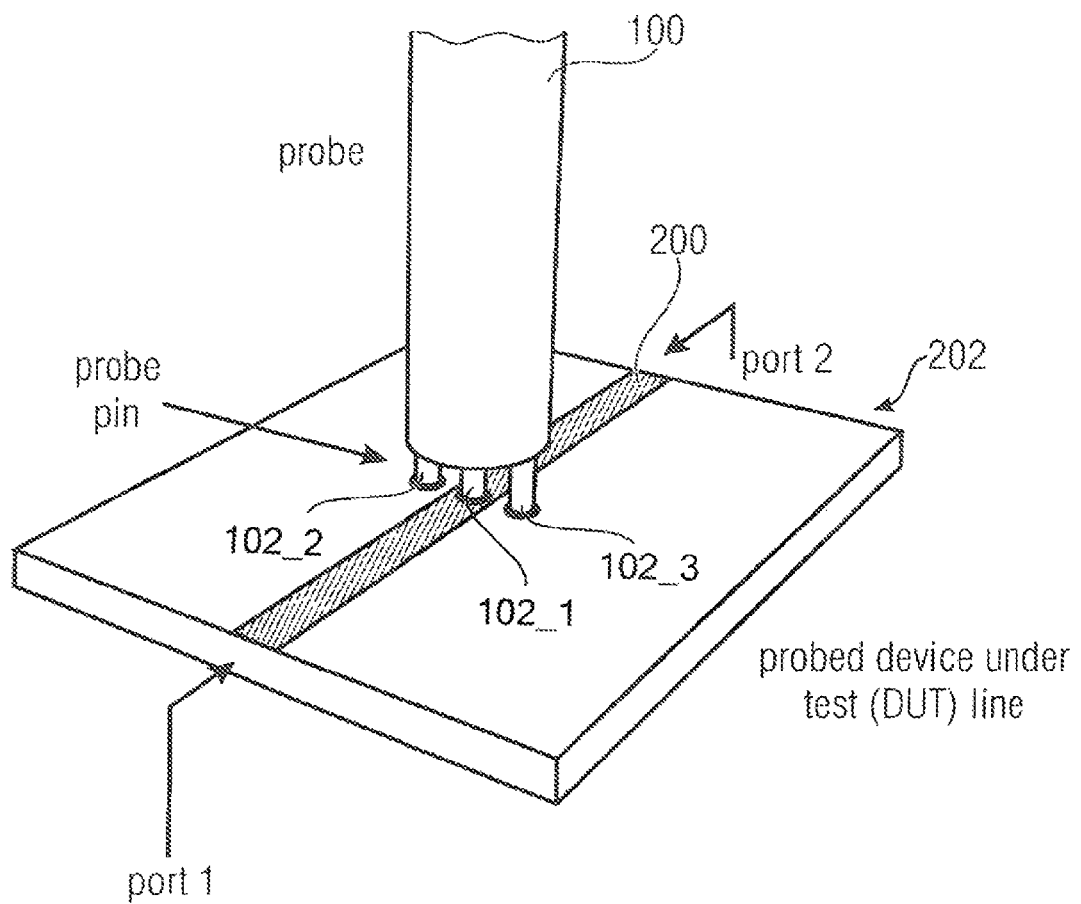
FIG. 4 shows an illustrative view of the transmission line of a circuit and of the RF probe for coupling out the probe signal from the transmission line, according to an embodiment of the present invention.

FIG. 4 shows an illustrative view of the transmission line 200 of a circuit 202, e.g., a device under test (DUT), and of the RF probe 100 for coupling out the probe signal 110 from the transmission line 200, according to an embodiment of the present invention.

As shown in FIG. 4, the probe pins 102_1 to 102_n (n≥2) can be configured to form an asymmetrical transmission line. For example, the RF probe 100 can comprise three pins 102_1 to 102_n (n=3), wherein a first pin 102_1 of the three probe pins 102_1 to 102_n (n=3) can be a signal pin, wherein a second pin 102_2 and a third pin 102_3 of the three probe pins 102_1 to 102_n (n=3) can be reference potential (e.g., ground) pins, and wherein the first pin 102_1 is arranged between the second pin 102_2 and the third pin 102_3.

Subsequently, the at least two probe pins 102_1 to 102_n (n≥2) are shown in block diagram form and denoted with the reference numeral 102 in FIGS. 5, 8, 11A and 11B.

Figure 5:
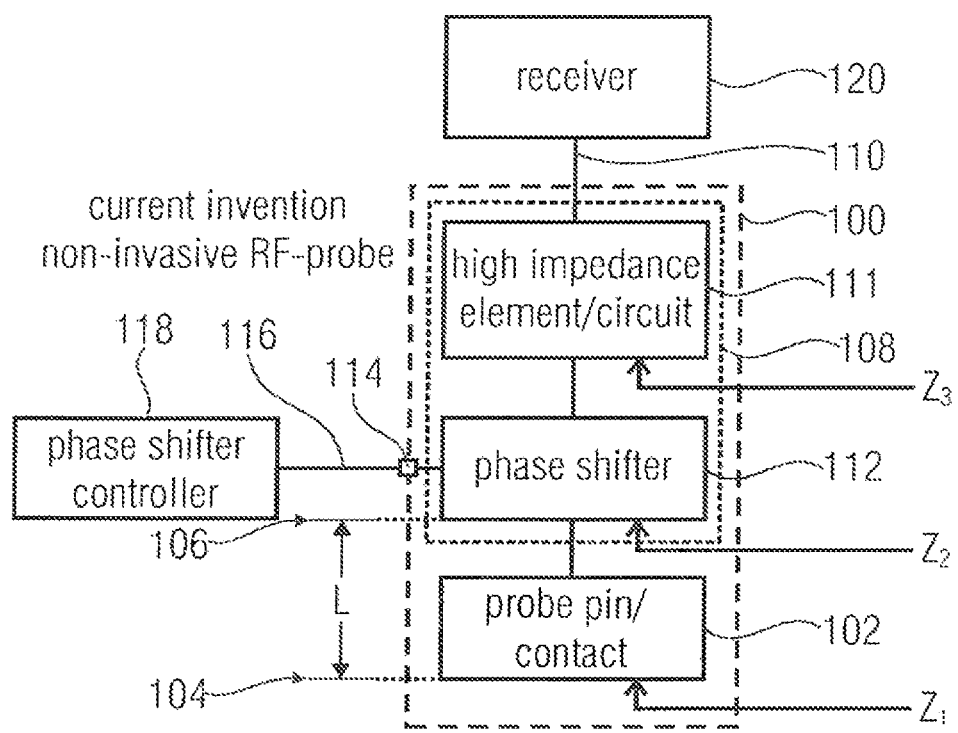
FIG. 5 shows a block diagram of an RF probe according to an embodiment of the present invention, wherein the means for providing the variable impedance comprises a high impedance circuit and a variable phase shifter.

FIG. 5 shows a block diagram of an RF probe 100 according to an embodiment of the present invention, wherein the means 108 for providing the variable impedance comprises a high impedance circuit 111 and a variable phase shifter 112. The variable phase shifter 112 is connected in series between the second ends 106 of the probe pins 102 and the high impedance circuit 111.

The variable phase shifter 112 can be configured to transform an impedance $Z_3$ of the high impedance circuit 111 into an impedance $Z_2$ present at the second ends 106 of the probe pins 102. Moreover, as already indicated, the probe pins 102 form a transmission line which transform the impedance $Z_2$ present at the second ends 106 of the probe pins 102 into a transformed impedance $Z_1$ present at the first ends 104 of the probe pins 102. Thus, the impedance $Z_1$ provided by the high impedance circuit 111 is transformed by the variable phase shifter 112 and the probe pins into the transformed impedance $Z_1$ at the first ends 104 of the probe pins 102.

Moreover, the variable phase shifter 112 can be configured to transform the high impedance $Z_3$ of the high impedance circuit 111 into an impedance $Z_2$ present at the second ends 106 of the probe pins 102 such that the frequency at which a high impedance occurs at the first ends 104 of the probe pin 102 is variable.

The high impedance circuit 111 can comprise a high impedance element, such as a resistor or a field effect transistor, for providing the impedance $Z_3$. The high impedance circuit 111 can be configured to provide an impedance $Z_3$ having a magnitude greater than or equal to 500Ω (or 250Ω, or 750Ω).

The variable phase shifter 112 can be switchable between at least two different phases. For example, the variable phase shifter 112 can be switchable between two, three, four, five, six, seven or even more different phases. Moreover, the variable phase shifter may also be configured to provide a continuous phase shift.

In some embodiments, the variable phase shifter 112 can comprise a control terminal 114 configured to receive a control signal 116. The variable phase shifter 112 can be configured to set a phase shift applied to a signal propagating between the second ends 106 of the probe pins 102 and the high impedance circuit 111 based on the control signal 116.

For example, an external phase shift controller 118 may provide the control signal 116 based on an operating frequency of the signal propagating along the transmission line 200 of the circuit 202 such that the RF probe 100 provides a high impedance (e.g., $Z_1$>500Ω) at the first ends 104 of the probe pins 102 at the operating frequency of the signal propagating along the transmission line 200 of the circuit 202.

In other words, the embodiment of the probe 100 construction depicted in FIG. 5 can comprise a probe contact/pin 102, a phase shifter 112 and a high-impedance component/circuitry 111.

The probe pin/contact 102 can comprise three pins 102_1 to 102_n (n=3), wherein a first pin 102_1 of the three pins 102_1 to 102_n (n=3) can be a signal pin, and wherein the second pin 102_2 and the third pin 102_3 of the three pins 102_1 to 102_n (n=3) can be ground pins bounding the first pin 102_1.

The phase shifter 112 can be electronically or mechanically implemented. The phase shifter 112 can be configured to change the phase of the signal, which produces the same effect as varying the impedance. The phase shifter controller 118 can be some means to change the phase shifter 112 settings. The receiver 120 can be a power sensor, a spectrum analyzer, an oscilloscope, a network analyzer or any other equipment that could sense RF signals.

As shown in FIG. 5, the high impedance circuit 111 can be configured to provide the probe signal 110. Furthermore, the high impedance circuit 111 can be connected to an external receiver 120.

Figure 13:
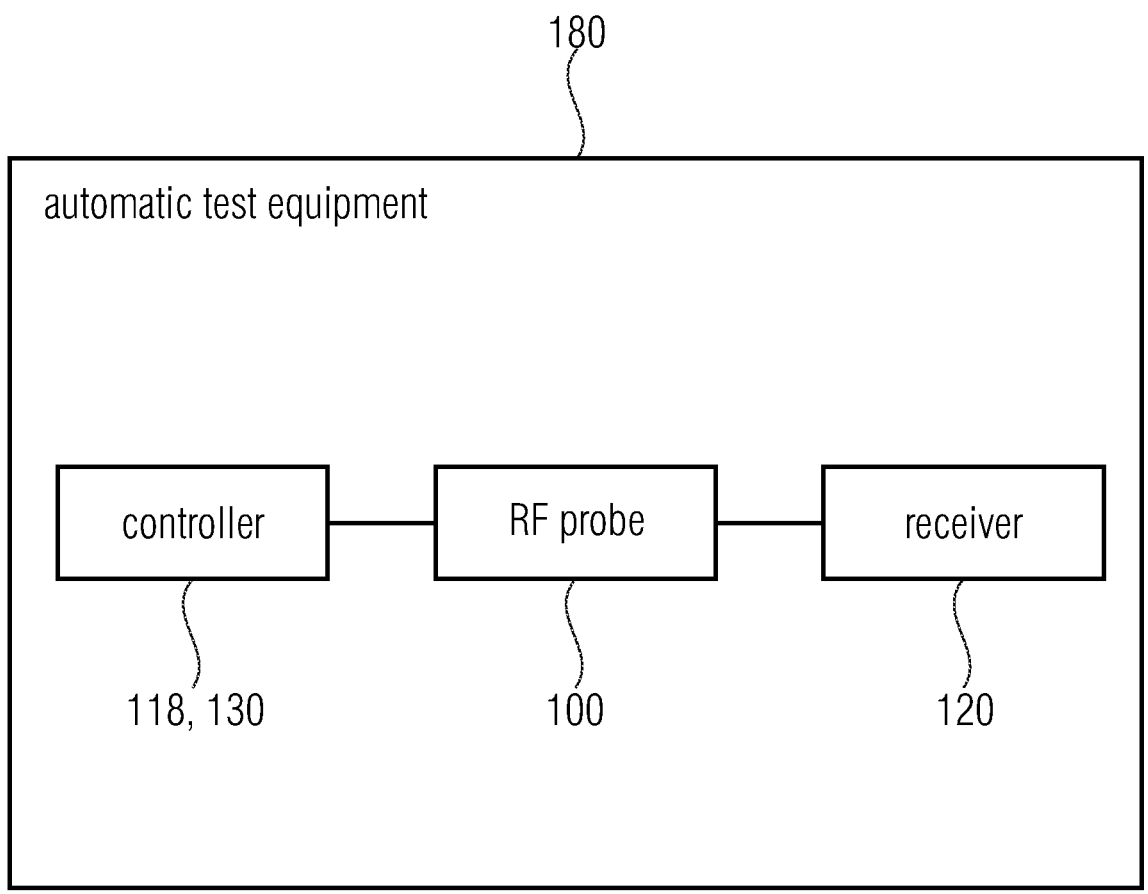
FIG. 13 shows a block diagram of an automated test equipment 200 according to an embodiment of the present invention.

In some embodiments, the RF probe 100, the phase shift controller 118 and the receiver 120 shown in FIG. 5 may form or be part of an automated test equipment as will become clear from the description of FIG. 13.

Figure 6:
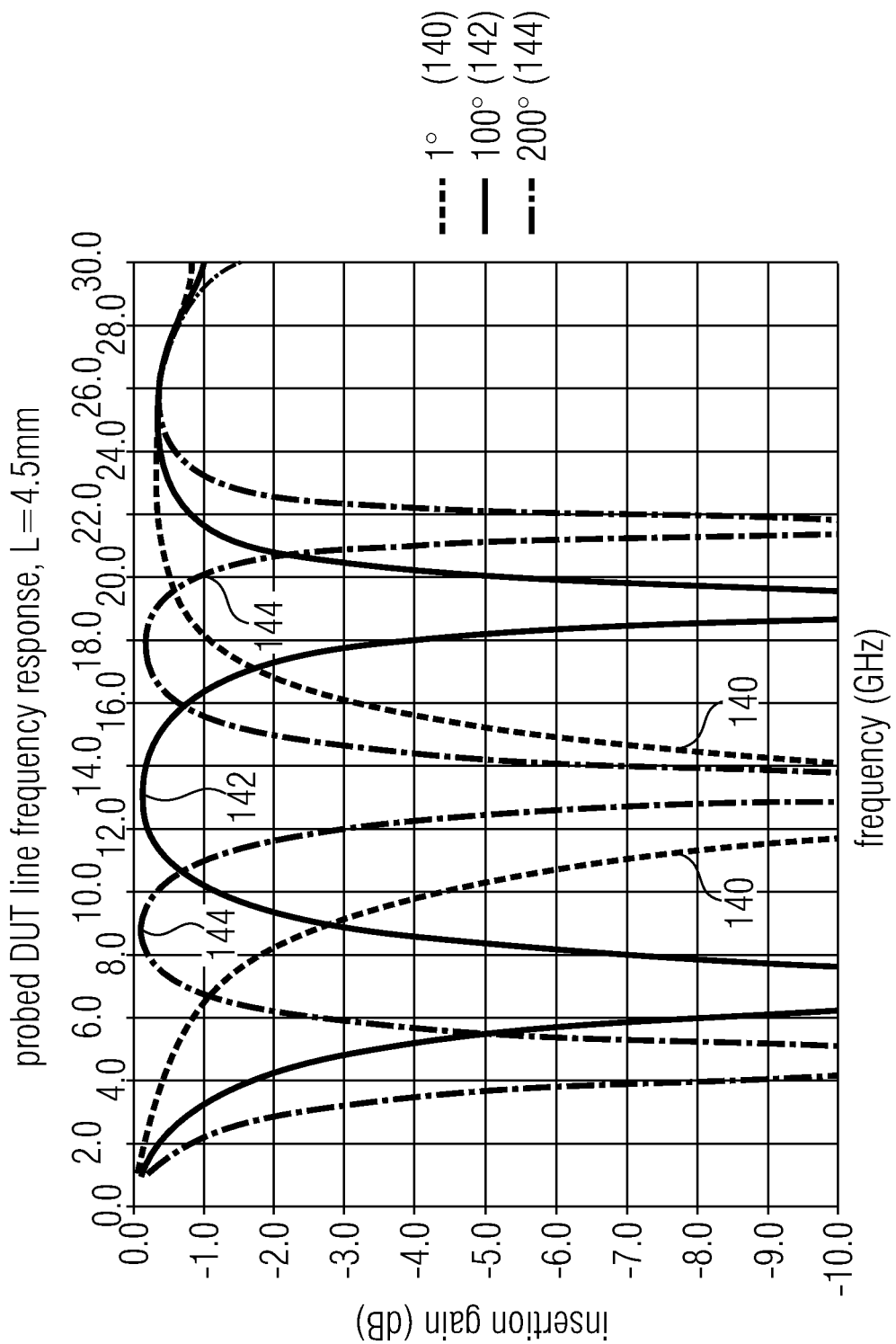
FIG. 6 shows in a diagram the insertion gain on the signal propagating along the transmission line of the circuit caused by the RF probe shown in FIG. 5 with probe pins having a length of 4.5 mm, according to an embodiment of the present invention.

FIG. 6 shows in a diagram the insertion gain on the signal propagating along the transmission line 200 of the circuit caused by the RF probe 100 shown in FIG. 5 with probe pins 102 having a length of 4.5 mm, according to an embodiment of the present invention. In other words, FIG. 6 shows the probe DUT line frequency response. Thereby, the ordinate describes the insertion gain (negative insertion loss) in dB, where the abscissa describes the frequency in GHz.

In FIG. 6, a first curve 140 denotes the frequency response of the transmission line 200 of the circuit 202 for a phase shift of 1°, wherein a second curve 142 denotes the frequency response of the transmission line 200 of the circuit 202 for a phase shift of 100°, and wherein a third curve 144 denotes the frequency response of the transmission line 200 of the circuit 202 for a phase shift of 200°

In other words, the variable phase shifter 112 can be configured to be switchable between 1°, 100° and 200°. Naturally, the variable phase shifter can also be switchable between any other phase shift values, such as 0°, 10°, 20°, 50°, 60°, 120°, 150°, 180°, 210°, 240°, 270°, 300° and 330°.

As shown in FIG. 6, the frequency ranges where the probe 100 behaves as high impedance is at the regions where the insertion loss (negative insertion gain) of the probed DUT line 200 is sufficiently low. In FIG. 6 for a phase setting of 1° (curve 140) the high impedance regions of the RF probe 100 are from 1.0 to 7.5 GHz, and 17 to 30 GHz, assuming an acceptable insertion loss on the probed DUT line of 1.5 dB.

The frequency region outside the ranges mentioned above, i.e. 7.5 GHz to 17 GHz, is the invasive region where the RF probe 100 is low impedance thus causing significant insertion loss to the probed DUT line 200.

When a frequency measurement is desired at these invasive regions, the phase shifter setting can be varied to alter the frequency response of the probed DUT line 200 and move the non-invasive region as desired. For example, a second phase shifter setting of 100° (curve 142) has the high impedance regions of the RF probe 100 (and therefore where measurements can be done) at 1 to 4 GHz, 10 to 17 GHz and 21 to 30 GHz.

Figure 7:
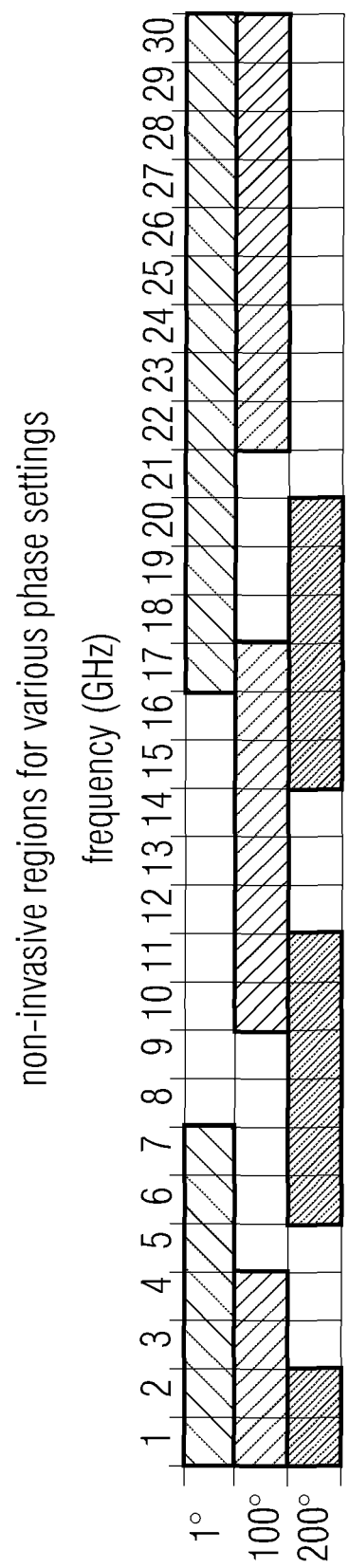
FIG. 7 shows in a table the non-invasive frequency regions of the RF probe 100 shown in FIG. 5 for phase shifts of 1°, 100° and 2000.

FIG. 7 shows in a table the non-invasive frequency regions of the RF probe 100 shown in FIG. 5 for phase shifts of 1°, 100° and 200°.

The frequency points and the corresponding phase shifter setting where the RF probe 100 is non-invasive can be noted during the factory calibration of the RF probe 100, as well as the relevant signal losses on each frequency.

A continuous measurement sweep from 1 GHz to 30 GHz, for example, can then be made by alternating between different phase shifter settings in order to operate the probe at the non-invasive regions.

In a possible implementation of the embodiment of the RF probe 100 shown in FIG. 5, the probe pins can be a ground-signal-ground (GND-SIG-GND) combination for a broadband performance. However, a sufficiently designed signal-ground (SIG-GND) combination can also be used.

The phase shifter 112 can be a reciprocal network in which the characteristic of port1-port2 is the same as port2-port1. A switched line phase shifter can be an electronic phase shifter implementation, or a mechanical coaxial phase shifter.

Figure 8:
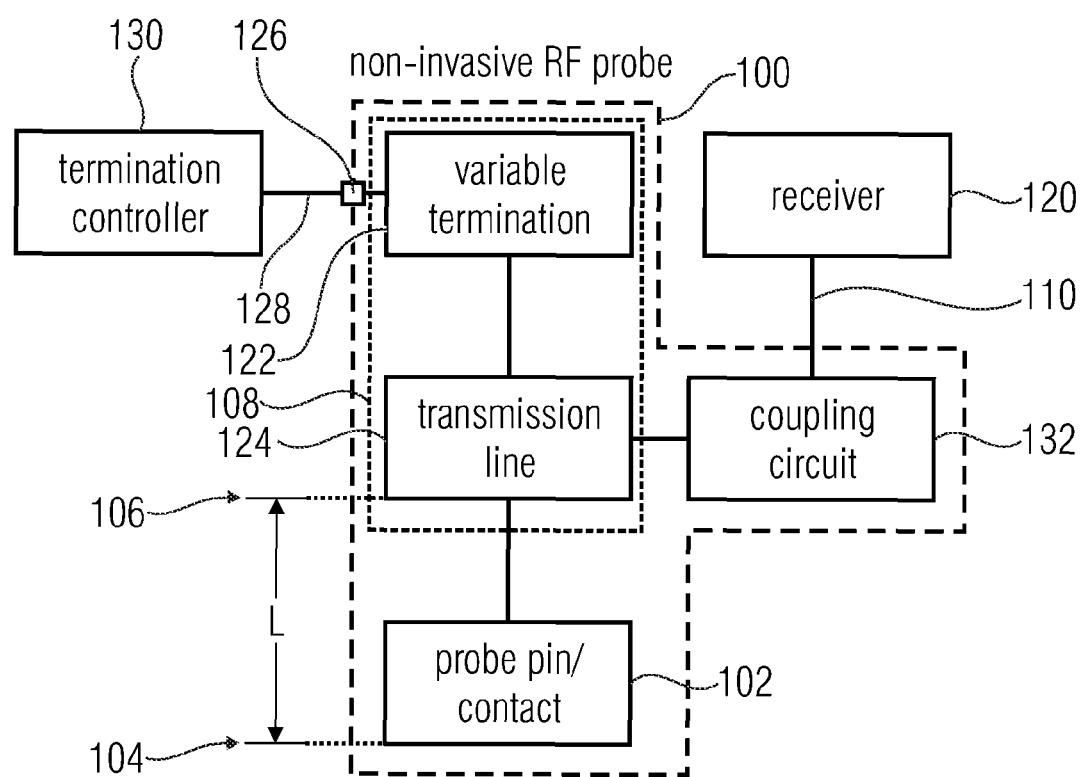
FIG. 8 shows a block diagram of an RF probe according to an embodiment of the present invention, wherein the means for providing the variable impedance comprises a variable termination circuit and a transmission line.

FIG. 8 shows a block diagram of an RF probe 100 according to an embodiment of the present invention, wherein the means 108 for providing the variable impedance comprises a variable termination circuit 122 and a transmission line 124. The transmission line 124 is connected in series between the second ends 106 of the probe pins 102 and the variable termination circuit 122.

The variable termination circuit 122 can comprise a control terminal 126 configured to receive a control signal 128. The variable termination circuit 122 can be configured to be switched between the at least two termination states for the transmission line 124 based on the control signal 128.

The at least two termination states can comprise a high impedance and low impedance. Naturally, the variable termination circuit 122 can also provide any other termination state, such as a termination state providing a high impedance, e.g., having a magnitude of 500 Ω, 750 Ω, 1000 Ω, 1500Ω or even open ended, or in a range between 700 to 1100Ω or between 500 and 1500Ω, for the transmission line 124; or a low impedance having a magnitude of 1 Ω, 10 Ω, 15Ω or even shorted, or in a range between 0.5 and 5Ω or 0.1 and 10Ω.

As indicated in FIG. 8, the control terminal 126 of the variable termination circuit 122 can be connected to an external termination controller 130. The external termination controller 130 may provide the control signal 128, for example, based on an operating frequency of the signal propagating along the transmission line 200 of the circuit 202 such that the RF probe 100 provides the high impedance at the first ends 104 of the probe pins 102 at the operating frequency of the signal propagating along the transmission line 200 of the circuit 202.

Moreover, the RF probe 100 can comprise a coupling circuit 132 configured to couple out a signal propagating along the transmission line 124 (or the probe pin(s) 102) to obtain the probe signal 110.

The coupling circuit 132 can be configured to provide the probe signal 110. Furthermore, the coupling circuit 132 can be connected to an external receiver 120.

In some embodiments, the RF probe 100, the termination controller 130 and the receiver 120 shown in FIG. 8 may form or be part of an automated test equipment as will become clear from the description of FIG. 13.

In other words, a second embodiment of the present invention is depicted in FIG. 8, comprised of a probe pin 102, a transmission line 124, a variable termination 122 at the end of the transmission line 124 and a coupling element 132 that receives a sample of the measured signal and feeds it to a receiver 120. The variable termination 122 can be varied by the termination controller 130 between (at least) two states, e.g., high and low impedance.

Figure 9:
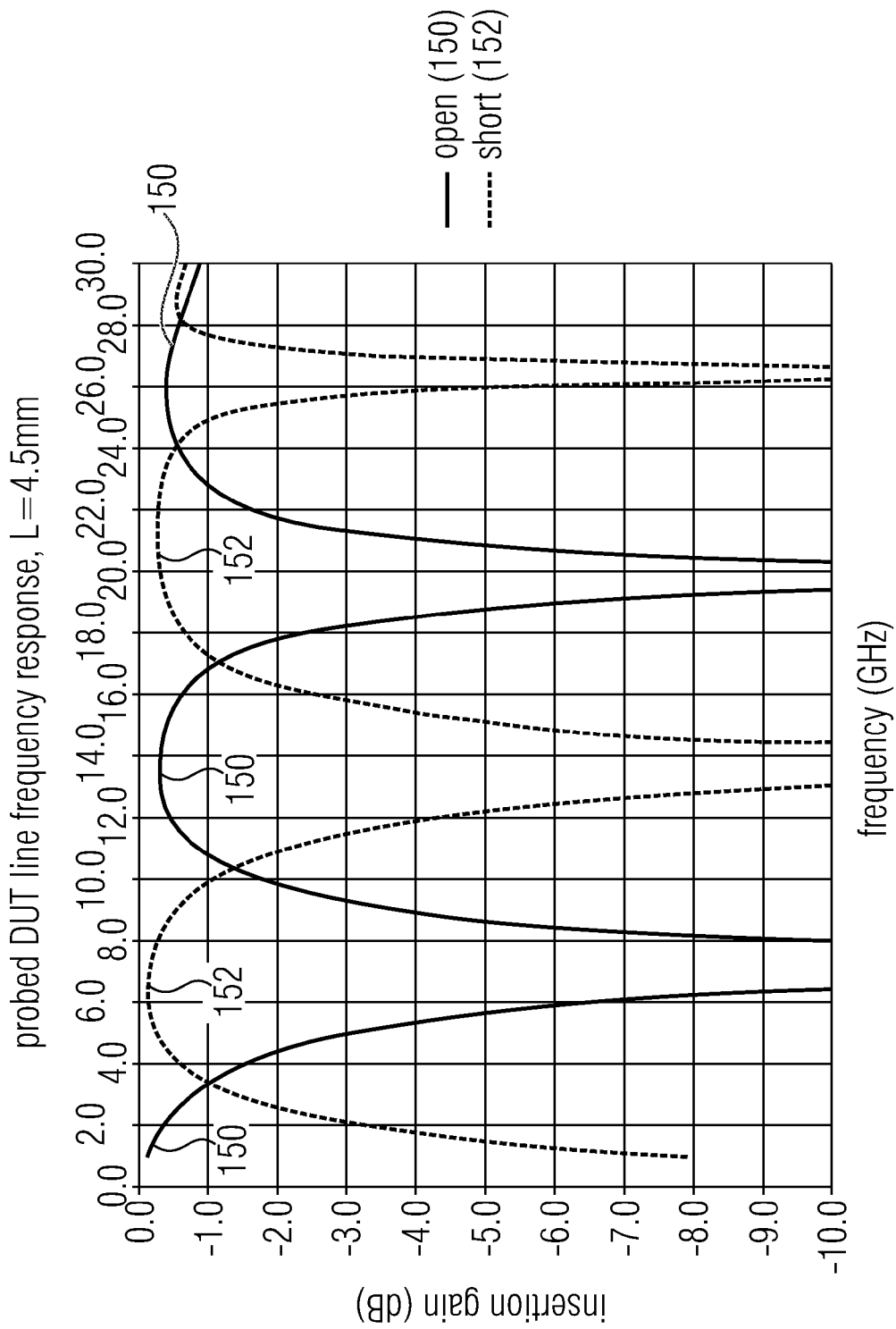
FIG. 9 shows in a diagram the insertion gain on the signal propagating along the transmission line of the circuit caused by the RF probe shown in FIG. 8 with probe pins having a length of 4.5 mm, according to an embodiment of the present invention.

FIG. 9 shows in a diagram the insertion gain on the signal propagating along the transmission line 200 of the circuit 202 caused by the RF probe 100 shown in FIG. 8 with probe pins 102 having a length of 4.5 mm, according to an embodiment of the present invention. In other words, FIG. 9 shows the probed DUT line frequency response. Thereby, the ordinate describes the insertion gain (negative insertion loss) in dB, where the abscissa describes the frequency in GHz.

In FIG. 9, a first curve 150 denotes a very high impedance or an open end termination state of the transmission line 124 provided by the variable termination circuit 122, wherein a second curve 152 denotes a very low impedance or a shorted termination state of the transmission line 124 provided by the variable termination circuit 122.

In other words, the frequency response of the probed DUT line 200 with the RF probe 100 having an open termination is shown in FIG. 9. As in the embodiment shown in FIG. 5, the frequency ranges where the RF probe 100 is non-invasive appear as the bands with low-insertion loss on the probed DUT line 200. The RF probe 100 can be used for in circuit measurements at these frequency ranges.

At these frequencies, the signal that is picked up from the probed DUT line 200 can then be coupled to the receiver 120 via the coupling network 132.

When measurements are desired at points where the RF probe 100 is invasive (notch regions on the probed DUT line 200 frequency response (curve 150)), the variable termination 122 can be switched to short by the termination controller 130. This creates the behavior shown as curve 152, where it fills-in the notches in the open termination.

As in the open termination, the useable operating frequencies for the RF probe 100 with short termination are the frequencies where the new low insertion loss regions are. At these frequencies, the signal that is picked up from the probed DUT line can then be coupled to the receiver 120 via the coupling network 132.

Figure 10:
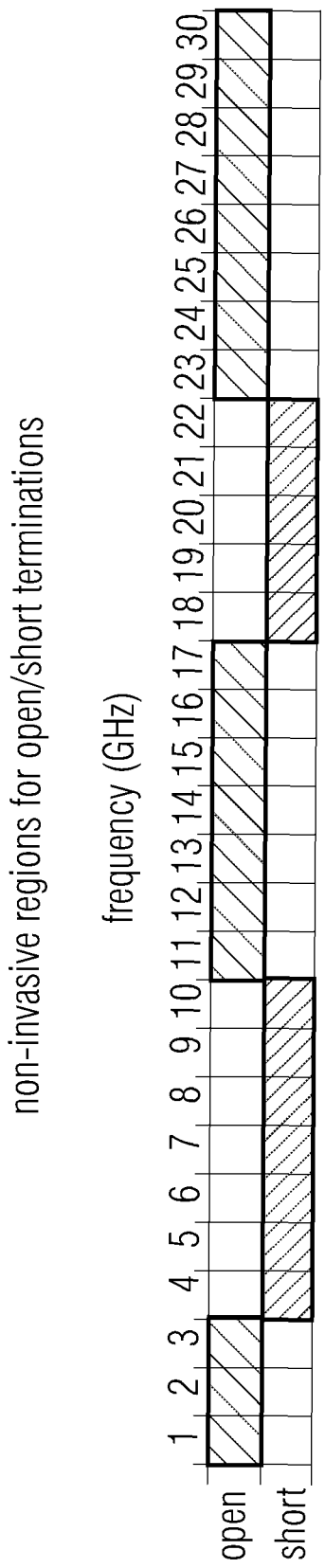
FIG. 10 shows in a table the non-invasive frequency regions of the RF probe shown in FIG. 8 for the termination states open ended and shorted.

FIG. 10 shows in a table the non-invasive frequency regions of the RF probe 100 shown in FIG. 8 for the termination states open ended and shorted. In other words, FIG. 10 summarizes the regions where the RF probe 100 is non-invasive at various terminations.

The frequency regions and the corresponding termination settings (open/short) at which the RF probe 100 is non-invasive can be noted down during factory calibration. The signal losses including the coupling losses can form part of the calibration as well.

A continuous measurement sweep from 1 GHz to 30 GHz, for example, can then be made by alternating between the two terminations (open and short) in order to operate the RF probe 100 at the non-invasive regions.

In a possible implementation, the probe pins 102 can be a ground-signal-ground (GND-SIG-GND) combination for a broadband performance. However, a sufficiently designed signal-ground (SIG-GND) combination can also be used.

The variable termination 122 can be (or comprise) a PIN diode (PIN=positive intrinsic negative), with one end connected to ground. The diode can be turned on or off in order to connect and disconnect to ground.

Figure 11A:
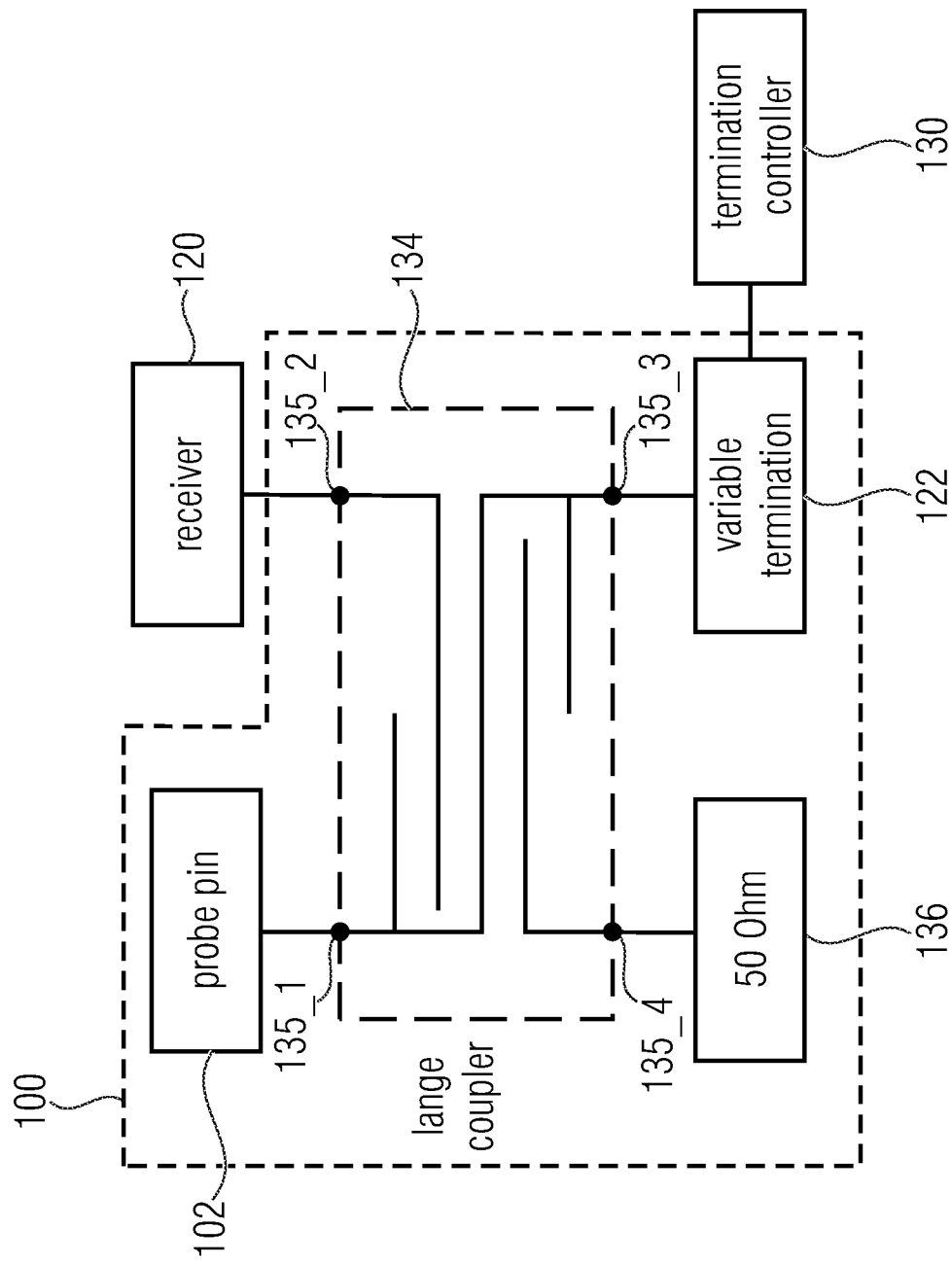
FIG. 11a shows a block diagram of the RF probe according to an embodiment of the present invention, wherein the means for providing the variable impedance comprises a variable termination circuit and a Lange coupler.

FIG. 11a shows a block diagram of the RF probe 100 according to an embodiment of the present invention, wherein the means 108 for providing the variable impedance comprises a variable termination circuit 122 and a Lange coupler 134. The Lange coupler 134 can be connected in series between the second ends 106 of the probe pins 102 and the variable termination circuit 122.

As indicated in FIG. 11a, the Lange coupler 134 can be connected to a termination impedance 136, e.g., providing an impedance having a magnitude of 50Ω. Note that the termination impedance 136 can be implemented internally or externally of the RF probe 100.

The Lange coupler 134 can comprise a first port 135_1 connected to the probe pin 102, a second port 135_2 configured to be connected to the receiver 120, a third port 135_3 connected to the variable termination 122 and a fourth port 135_4 connected to the termination impedance 136. Furthermore, the Lange coupler 134 can comprise a direct electrical path connecting the first port 135_1 and third port 135_3. The second port 135_2 and the fourth port 135_4 can be connected directly as well. The signal travelling across 135_1 and 135_3 can be coupled to 135_2 and 135_4 by means of capacitive or inductive coupling.

In other words, the transmission line block 124 and the coupling network 132 shown in FIG. 8 can be implemented as one quadrature coupler. An implementation can be a Lange coupler 134 to achieve wideband coupling. The result shown in FIG. 9 uses a Lange coupler 134, centered at 15 GHz.

When a Lange coupler 134 implementation is used (FIG. 11a), the termination 122 can be placed at the direct port 135_3, i.e. at the end of the line where the input 135_1 is. The receiver 120 input can be connected to the coupled port 135_2, while the isolated port 135_4 can be terminated with 50 ohms. Alternatively and without loss of generality, the receiver 120 input can be connected to the port 135_4 and the coupled port 135_2 be terminated with 50 ohms.

The coupling coefficient, or the amount of power coupled to the receiver 120, directly affects the insertion loss of the probed DUT line 200, i.e. the amount of invasiveness. The more the coupled power is to the receiver 120, the higher the insertion loss or invasiveness. A coupling power of 10 dB is used in the result shown in FIG. 9.

FIG. 11b shows a block diagram of a possible implementation of the Lange coupler 134 of the means 108 for providing the variable impedance of the RF probe 100 shown in FIG. 11a.

Note that the Lange coupler 134 may be a four or more finger 160_1 to 160_v (v≥4) Lange coupler. For example, as shown in FIG. 11b, the Lange coupler 134 can comprise four fingers 160_1 to 160_v (v=4). Naturally, the Lange coupler 134 can also comprise more than four fingers 160_1 to 160_v (v≥4), such as five, six, seven, eight, nine, ten or even more fingers.

Figure 12:
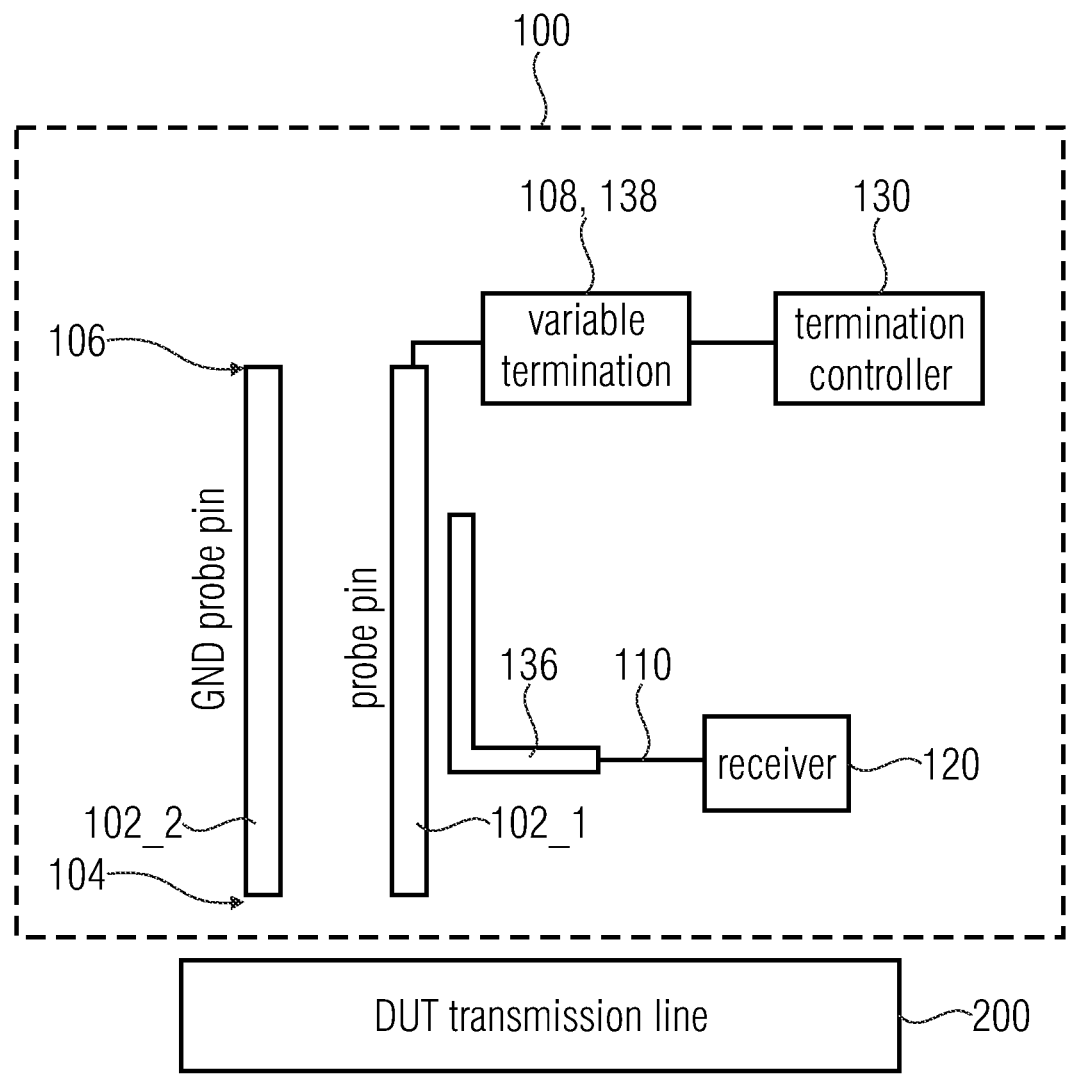
FIG. 12 shows a block diagram of an RF probe according to a further embodiment of the present invention.

FIG. 12 shows a block diagram of an RF probe 100 according to a further embodiment of the present invention. The RF probe 100 comprises means 136 for coupling out the signal propagating along the at least one of the probe pins 102_1 to 102_n (n≥2) to obtain the probe signal 10. The means 108 for providing the variable impedance 108 comprises a variable impedance 138 connected in series between the second end 106 of the at least one of the probe pins 102_1 to 102_n (n≥2) and a reference terminal 139 configured to provide a reference potential, e.g. ground potential.

FIG. 13 shows a block diagram of an automated test equipment 180 according to an embodiment of the present invention. The automated test equipment 180 comprises the RF probe 100 described in detail above and a receiver 120. The receiver 120 can be a power sensor, a spectrum analyzer, an oscilloscope or a network analyzer.

As shown in FIG. 13, the automated test equipment 180 can comprise a controller, e.g., the phase shift controller 118 shown in FIG. 5 and/or the termination controller 130 shown in FIG. 8, configured to provide the respective control signal to control the variable impedance of the RF probe 100.

For example, the automated test equipment 180 can be configured to control an operating frequency of the circuit 202 and to control the variable impedance provided by the means 108 for providing the variable impedance based on the operating frequency.

Moreover, the automated test equipment 180 can be configured to control an operating frequency of the receiver 120 and to control the variable impedance provided by the means 108 for providing the variable impedance based on the operating frequency.

Furthermore, the automated test equipment 180 can be configured to provide the control signal 116, 128 based on an operating frequency of a signal propagating along the transmission line 200 of the circuit 202 such that the RF probe 100 provides a high impedance at the first ends 104 of the probe pins 102 at the operating frequency of the signal propagating along the transmission 200 line of the circuit 202.

Figure 14:
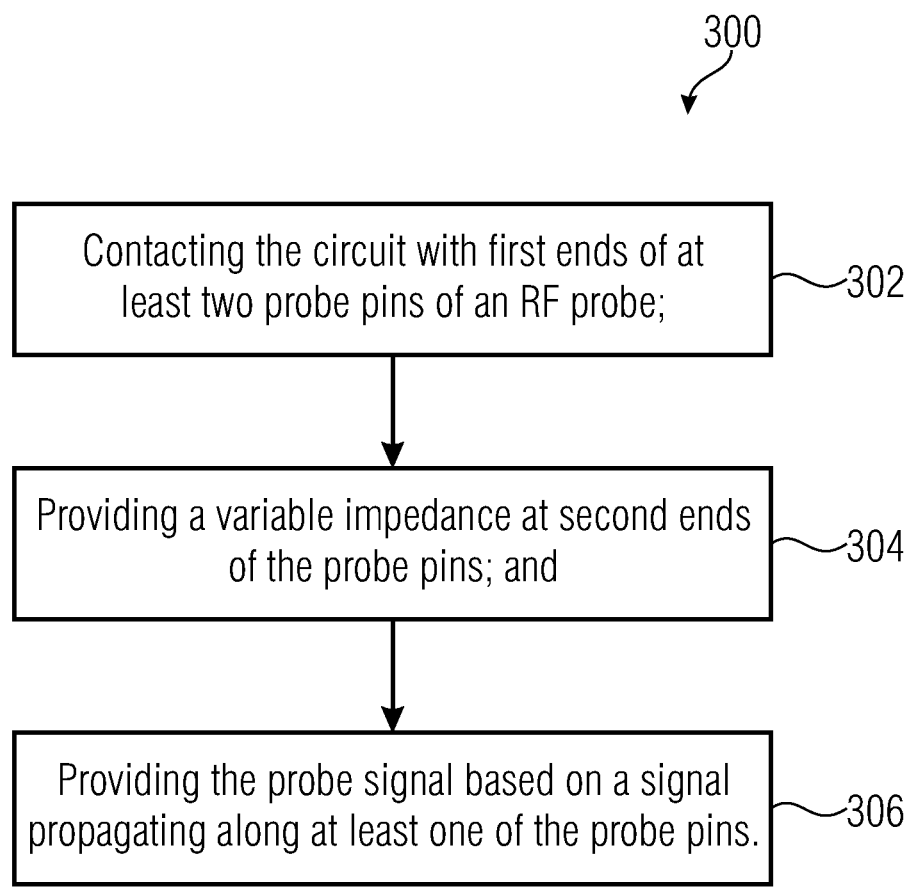
FIG. 14 shows a flowchart of a method for coupling out a probe signal from a transmission line of a circuit.

FIG. 14 shows a flowchart of a method 300 for coupling out a probe signal from a transmission line of a circuit. The method 300 comprises contacting 302 the circuit with first ends of at least two probe pins of an RF probe. Further, the method 300 comprises providing 304 a variable impedance at second ends of the probe pins. Further, the method 300 comprises providing 306 the probe signal based on a signal propagating along at least one of the probe pins.

In some embodiments, the method 300 further comprises providing the control signal based on an operating frequency of a signal propagating along the transmission line of the circuit such that the RF probe provides a high impedance at the first ends of the probe pins at the operating frequency of the signal propagating along the transmission line of the circuit.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. An RF probe comprising:
   at least two probe pins each including first ends for contacting a circuit and second ends, wherein a length of the probe pins is greater than $\lambda/10$, wherein $\lambda$ is a wavelength of a probe signal coupled out by the RF probe; and
   a variable impedance coupled to the second ends of the probe pins;
   wherein the RF probe is configured to provide the probe signal coupled out by the RF probe based on a probe signal propagating along at least one of the probe pins; and
   wherein the variable impedance is configured to provide an impedance at the second ends of the probe pins, wherein the variable impedance varies a frequency of the impedance at the second ends of the probe pins in response to a control signal that changes in response to changes in an operating frequency of the circuit such that an impedance occurs at the first ends of the probe pins in correspondence with the operating frequency of the circuit.

2. The RF probe according to claim 1, wherein the variable impedance comprises an impedance circuit and a variable phase shifter connected in series between the second ends of the probe pins and the high impedance circuit.

3. The RF probe according to claim 2, wherein the variable phase shifter comprises a control terminal configured to receive the control signal, wherein the variable phase shifter is configured to set a phase shift applied to a signal propagating between the second ends of the probe pins and the high impedance circuit based on the control signal.

4. The RF probe according to claim 2, wherein the variable phase shifter is configured to transform an impedance of the impedance circuit into an impedance present at the second ends of the probe pins.

5. The RF probe according to claim 2, wherein the variable phase shifter is configured to be switchable between at least two different phases.

6. The RF probe according to claim 1, wherein the variable impedance comprises a variable termination circuit and a transmission line connected in series between the second ends of the probe pins and the variable termination circuit.

7. The RF probe according to claim 6, wherein the variable termination circuit comprises a control terminal configured to receive the control signal, wherein the variable termination circuit is configured to be switched between at least two termination states for the transmission line based on the control signal.

8. The RF probe according to claim 6, wherein the at least two termination states comprise open ended and shorted.

9. The RF probe according to claim 6, wherein the RF probe comprises a coupling circuit configured to couple out a signal propagating along the transmission line to acquire the probe signal.

10. The RF probe according to claim 1, wherein the RF probe comprises a coupler for coupling out the signal propagating along the at least one of the probe pins to acquire the probe signal; and wherein the variable impedance comprises a variable impedance connected in series between the second end of the at least one of the probe pins and a reference terminal configured to provide a reference potential.

11. The RF probe according to claim 1, wherein the variable impedance comprises a variable termination circuit and a Lange coupler connected in series between the second ends of the probe pins and the variable termination circuit.

12. The RF probe according to claim 1, wherein the probe pins form a transmission line which transforms the impedance present at the second ends into a transformed impedance at the first ends.

13. The RF probe according to claim 1, wherein the probe pins are configured to form an asymmetrical transmission line.

14. A method comprising:
contacting a circuit with first ends of at least two probe pins of an RF probe, wherein a length of the probe pins is greater than $\lambda/10$, wherein $\lambda$ is a wavelength of a probe signal to be coupled out by the RF probe;
providing a variable impedance at second ends of the probe pins, wherein the variable impedance varies a frequency of the impedance at the second ends of the probe pins in response to a control signal that changes in response to changes in an operating frequency of the circuit such that a frequency at which an impedance occurs at the first ends of the probe pins is variable based on the operating frequency of the circuit; and
providing the probe signal propagating along at least one of the probe pins.

15. The method of claim 14, wherein providing the variable impedance includes providing a variable phase shift to the signal propagating between the second ends and the first ends of the probe pins based on the operating frequency of the probe signal.

16. A system comprising:
a probe including:
a variable impedance; and
a plurality of pins, wherein the variable impedance is coupled to second ends of the plurality of pins, and wherein the variable impedance is adjustable to transform an impedance at first ends of the plurality of pins used for contacting a circuit, wherein the variable impedance varies a frequency of the impedance at the second ends in response to a control signal that changes in response to changes in an operating frequency of the circuit such that an impedance occurs in correspondence with a variable operating frequency of the circuit; and
a receiver coupled to the probe for receiving the probe signal.

17. The system according to claim 16, wherein the variable impedance includes a variable phase shifter configured to set a phase shift applied to a signal propagating between the second ends of the plurality of pins to the first ends of the plurality of pins based on the control signal.

18. The system according to claim 16, wherein the receiver is a power sensor, a spectrum analyzer, an oscilloscope or a network analyzer.

19. The system according to claim 16, further comprising automated test equipment configured to provide the control signal.

20. The system according to claim 19, wherein the automated test equipment is configured to control the operating frequency of the circuit and to control the variable impedance based on the operating frequency.

21. The system according to claim 19, wherein the automated test equipment is configured to control an operating frequency of the receiver and to control the variable impedance based on the operating frequency.

* * * * *